United States Patent [19]

Kisor et al.

[11] Patent Number: 5,067,152
[45] Date of Patent: Nov. 19, 1991

[54] METHOD AND APPARATUS FOR VECTOR QUANTIZATION

[75] Inventors: Gregory H. Kisor, Boca Raton, Fla.; Edward J. King, Milpitas, Calif.

[73] Assignee: Information Technologies Research, Inc., Boca Raton, Fla.

[21] Appl. No.: 494,658

[22] Filed: Mar. 16, 1990

Related U.S. Application Data

[63] Continuation-in-part of Ser. No. 303,795, Jan. 30, 1989, Pat. No. 4,979,039.

[51] Int. Cl.⁵ .............................................. H04N 7/167
[52] U.S. Cl. .................................... 380/10; 381/31; 358/133; 341/106
[58] Field of Search .................. 380/10; 358/133, 135, 358/136, 11, 12, 432, 261.3; 341/106; 325/27, 122; 381/31, 32

[56] References Cited

U.S. PATENT DOCUMENTS

| | | |
|---|---|---|
| 4,017,669 | 8/1978 | Tewksbury . |
| 4,152,691 | 5/1979 | Ward . |
| 4,280,191 | 7/1981 | Rockett, Jr. . |
| 4,281,319 | 7/1981 | Roberts, Jr. . |
| 4,302,775 | 11/1981 | Widergren et al. . |
| 4,385,363 | 5/1983 | Widergren et al. . |
| 4,394,774 | 7/1983 | Widergren et al. . |
| 4,541,012 | 9/1985 | Tescher . |
| 4,558,350 | 12/1985 | Murakami ........................ 358/12 |
| 4,560,977 | 12/1985 | Murakami et al. ............... 364/807 |
| 4,639,778 | 1/1987 | Yamaguchi et al. . |
| 4,652,905 | 3/1987 | Lippel . |
| 4,727,354 | 2/1988 | Lindsay . |
| 4,791,654 | 12/1988 | DeMarca et al. . |
| 4,809,300 | 2/1989 | Goldstein et al. . |
| 4,811,265 | 3/1989 | Hashimoto et al. ............... 364/900 |
| 4,837,632 | 6/1989 | Kubo et al. . |
| 4,843,389 | 6/1989 | Lisle et al. ....................... 364/900 |
| 4,979,039 | 12/1990 | Kisor et al. ...................... 358/133 |

OTHER PUBLICATIONS

Arnstein, D. S., "Quantization Error in Predictive Coders", *IEEE Transactions on Communications*, vol. COM-23, No. 4, Apr. 1975, pp. 423–429.

Gersho, A., "Asympototically Optimal Block Quantization", *IEEE Transactions on Information Theory*, vol. IT-25, No. 4, Jul. 1979, pp. 373–380.

Linde et al., Y., "An Algorithm for Vector Quantizer Design", *IEEE Transactions on Communications*, vol. COM-28, No. 1, Jan. 1980, pp. 84–95.

Gray et al., R. M., "Distortion Measures for Speech Processing", *IEEE Transactions on Acoustics, Speech, and Signal Processing*, vol. ASSP-28, No. 4, Aug. 1980, pp. 367–376.

(List continued on next page.)

*Primary Examiner*—Thomas H. Tarcza
*Assistant Examiner*—Tod Swann
*Attorney, Agent, or Firm*—Panitch, Schwarze, Jacobs & Nadel

[57] ABSTRACT

A method of and apparatus for vector quantizaiton operates on binary signal vectors. Each signal vector contains a plurality of sample elements of a signal to be compressed. Each of the signal vectors is hashed to generate a value identifying one of at least three different subsets of code words collectively constituting a set of binary code words. Each of the signal vectors is hashed a second time to generate a value identifying one of at least three different subsets of code words collectively constituting a second different set of binary code words. Each code word is equal in length to the length of each of the signal vectors and has associated with it a unique binary code of a lesser length. The vector quantizer performs a distortion comparison search through the code words of the selected subset to identify the one code word and its uniquely associated code which has the least distortion of all of the code words of the one subset with respect to the hashed signal vector. That one code is outputted to represent the hashed signal vector. The subsets may be mutually exclusive and include a plurality of code words.

16 Claims, 3 Drawing Sheets

OTHER PUBLICATIONS

Gray et al., R. M., "Vector Quantizers and Predictive Quantizers for Gauss-Markov Sources", *IEEE Transactions on communications*, vol. COM-30, No. 2, Feb. 1982, pp. 381-389.

Gersho, A., "On the Structure of Vector Quantizers", *IEEE Transactions on Information Theory*, vol. IT-28, No. 2, Mar. 1982, pp. 157-166.

Gray et al., R. M., "Multiple Local Optima in Vector Quantizers", *IEEE Transactions on Information Theory*, vol. IT-28, No. 2, Mar. 1982, pp. 256, 261.

Abut et al., H., "Vector Quantization of Speech and Speech-Like Waveforms", *IEEE Transactions on Acoustics, Speech, and Signal Processing*, vol. ASSP-30, No. 3, Jun. 1982, pp. 423-435.

Feuche, M., "Video Storage Makes CD ROM More Versatile", *High Technology*, Jul. 1987, pp. 60-61.

1

METHOD AND APPARATUS FOR VECTOR QUANTIZATION

This application is a continuation-in-part of U.S. Pat. application Ser. No. 303,795, filed Jan. 30, 1989, now U.S. Pat. No. 4,797,039.

FIELD OF THE INVENTION

The invention relates to signal processing and, in particular, to data compression by vector quantization.

BACKGROUND

Data compression is the process of representing a large amount of data with a smaller amount. Data compression is typically used to map a large bandwidth signal into a smaller bandwidth channel for transmission or storage.

One method of data compression that has gained recent interest is vector quantization. Vector quantization has been found to afford a higher compression ratio without sacrificing significant signal quality to the degree required by other known data compression methods.

Vector quantization lends itself particularly well to audio or video signals that will be interpreted by human listeners and viewers. Human interpreted data require less accuracy than does machine interpreted data. For example, the data needed to store and identically reproduce a color video image displayed on a conventional television monitor, can be compressed significantly without losing the essence of the main image that the human viewer would discern.

To compress a signal by vector quantization, the signal, if not in digital form, is converted to a set of digital data elements and the digital data elements of the set grouped in some manner into blocks referred to as signal vectors. Signal vectors can be any N by M group of digitized data elements derived from the original signal, with N and M being any integer value.

Vector quantization further requires a collection of "code words", sometimes referred to as a "code book". Code words are representative vectors which are equal in size to the signal vectors being compressed. The code words are used to approximate the signal vectors generated from the original signal when the compressed representation of the original signal is decompressed. Typically, these representative vectors or code words are generated using a probability density function to identify the most commonly occurring signal vectors in the type of signals being compressed.

In vector quantization, each code word in the code book is assigned a unique associated binary code. The code has fewer binary bits than the code word itself and fewer binary bits than any signal vector represented by the code word. The smaller in size the code is with respect to the size of the signal vector, or, more accurately, the digital data used to generate the signal vector, the greater the compression that is achieved Typically, the code words of the code book would be stored in a random access memory for quick retrieval. The code uniquely associated with each code word can then be related to the unique address of the code word in the memory.

After creating a code book of code words, each of the signal vectors generated from a signal to be compressed is compared with the code words to find one code word that best represents the signal vector. This generally means finding a code word having minimal distortion with respect to the signal vector.

Originally, two main approaches were followed for comparing signal vectors with code words to determine minimal distortion: sequential search through the entire code book or tree structured search through part of the code book. Vector quantization by either approach is disclosed in detail, for example, in U.S. Pat. No. 4,560,977 to Murakami, et.al., incorporated by reference in its entirety herein.

Related patent U.S. Pat. No. 4,979,039 filed Jan. 30, 1989, discloses a third approach, more powerful in practice than either sequential or tree structured searching, namely hashing. Hashing represents the antithesis of an ordered search. Hashing, as it relates to practical vector quantization, involves the creation of a function which, when exercised on a signal vector, identifies one of at least three different subsets of code words in the set of code words within which a close approximation of the signal vector will be found. The signal vector is then compared with only the code words of the one identified subset and is replaced with the code of the code word of the identified subset having the least distortion with respect to the hashed signal vector.

The present invention is related to improvements in methods and apparatus for vector quantization by hashing.

SUMMARY OF THE INVENTION

In one aspect, the invention is a method of compressing an original signal convertible into a plurality of binary signal vectors, each signal vector containing a plurality of data elements of the original signal to be compressed. In this aspect, the method comprises the steps of hashing a first signal vector converted from the original signal to identify one of at least three different subsets of a first set of code words. Each code word of the first set has a unique, associated binary code. Each code associated with the first set of code words has a first predetermined length less than the length of the first signal vector. The method further comprises the step of storing a first code associated with one of the code words from the one identified subset of the first set as a compressed representation of the first signal vector. The method further comprises the step of having a second signal vector converted from the original signal to identify one of at least three different subsets of a second set of code words. Each code word of the second set also has a unique, associated binary code. Each code associated with the second set of code words has a second predetermined length less than the length of the second signal vector. The second set of code words differs from the first set of code words. The method further comprises the step of storing a second code associated with one of the code words from the one identified subset of the second set as a compressed representation of the second signal vector. In a related aspect, the invention further comprises a single, record storage element storing a plurality of codes, including the first and second codes, identified for each of the plurality of signal vectors as a compressed representation of the data of the original signal. In another related aspect, the invention further comprises the compressed signal generated by transmitting the plurality of identified codes.

In another aspect, the invention is an apparatus for compressing an original signal convertible into a plurality of binary signal vectors, each signal vector comprising a plurality of data elements of the original signal to be compressed. In this aspect, the apparatus comprises first data storage means for storing sets of binary code words. The apparatus further comprises at least first and second different sets of binary code words stored in the first data storage means. The apparatus further comprises means for hashing signal vectors of the plurality to identify uniquely for each hashed signal vector one subset of code words from one of the different sets of code words stored in the first storage means. The apparatus further comprises second data storage means for storing as a compressed representation of the data of the original signal, a plurality of binary codes, each stored code being associated with one code word from the one subset of code words identified by the hashing means uniquely for each hashed signal vector.

In another aspect, the invention comprises a method for decompressing data compressed from an original signal and represented as a plurality of binary codes of at least two different lengths. The method comprises the steps of identifying a first binary code word uniquely associated with a first code of the plurality. The first code word is longer than the first code. It further comprises identifying a second binary code word uniquely associated with a second code of the plurality. The second code word is longer than the second code and the second code is different in length from the first code. The method further comprises storing in a data storage device a decompressed binary approximation of the data of the original signal using a combination of the first and second binary code words. This aspect of the invention further includes a single, record storage element of the device containing the decompressed binary approximation of the data of the original signal.

In another aspect, the invention includes an apparatus for decompressing data compressed from an original signal and represented by a plurality of binary codes of at least two different lengths. The apparatus comprises a first data storage means for storing sets of binary code words and at least first and second different sets of binary code words in the first data storage means, the first set having a first number of code words and the second set having a second number of code words different from the first number. Each of the codes is associated with one of the code words of one of different sets of code words in the first storage means. Each stored code word has a length longer than the associated binary code. The apparatus further comprises means for identifying for each code one of the different sets of code words from the first data storage means containing the one code word associated with the code and identifying the one code word of the one identified set associated with the code and for converting the identified code words into decompressed data elements to approximating data of the original signal.

BRIEF DESCRIPTION OF THE DRAWINGS

The foregoing summary, as well as the following detailed description of the presently preferred embodiments of the invention, will be better understood when read in conjunction with the appended drawings. It should be understood, however, that this invention is not limited to the precise arrangements illustrated. In the drawings.

DETAILED DESCRIPTION OF PREFERRED EMBODIMENTS

Figure 1:
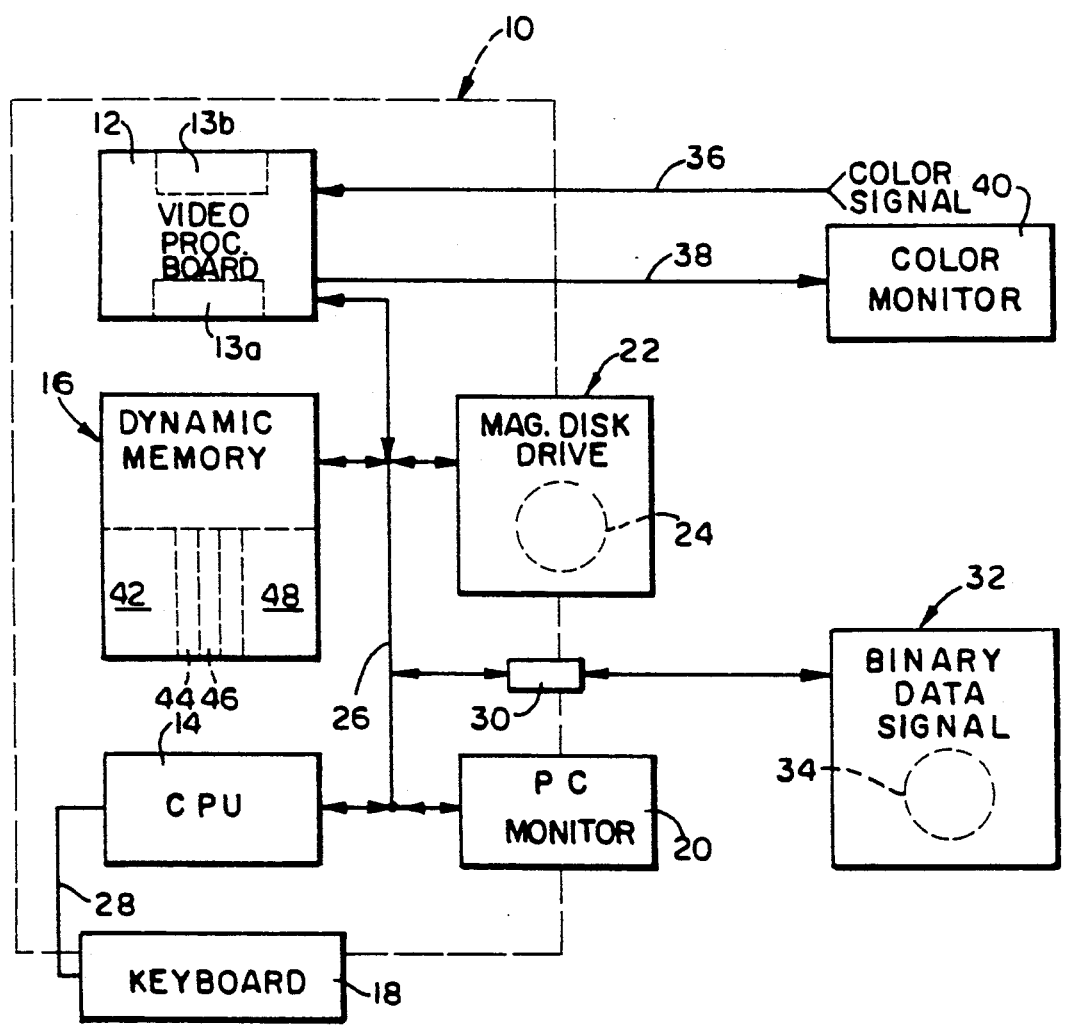
FIG. 1 depicts diagrammatically a preferred apparatus for capturing and compressing an original color video signal and for decompressing a compressed color video signal and transmitting the decompressed color video signal.
Figure 2A:
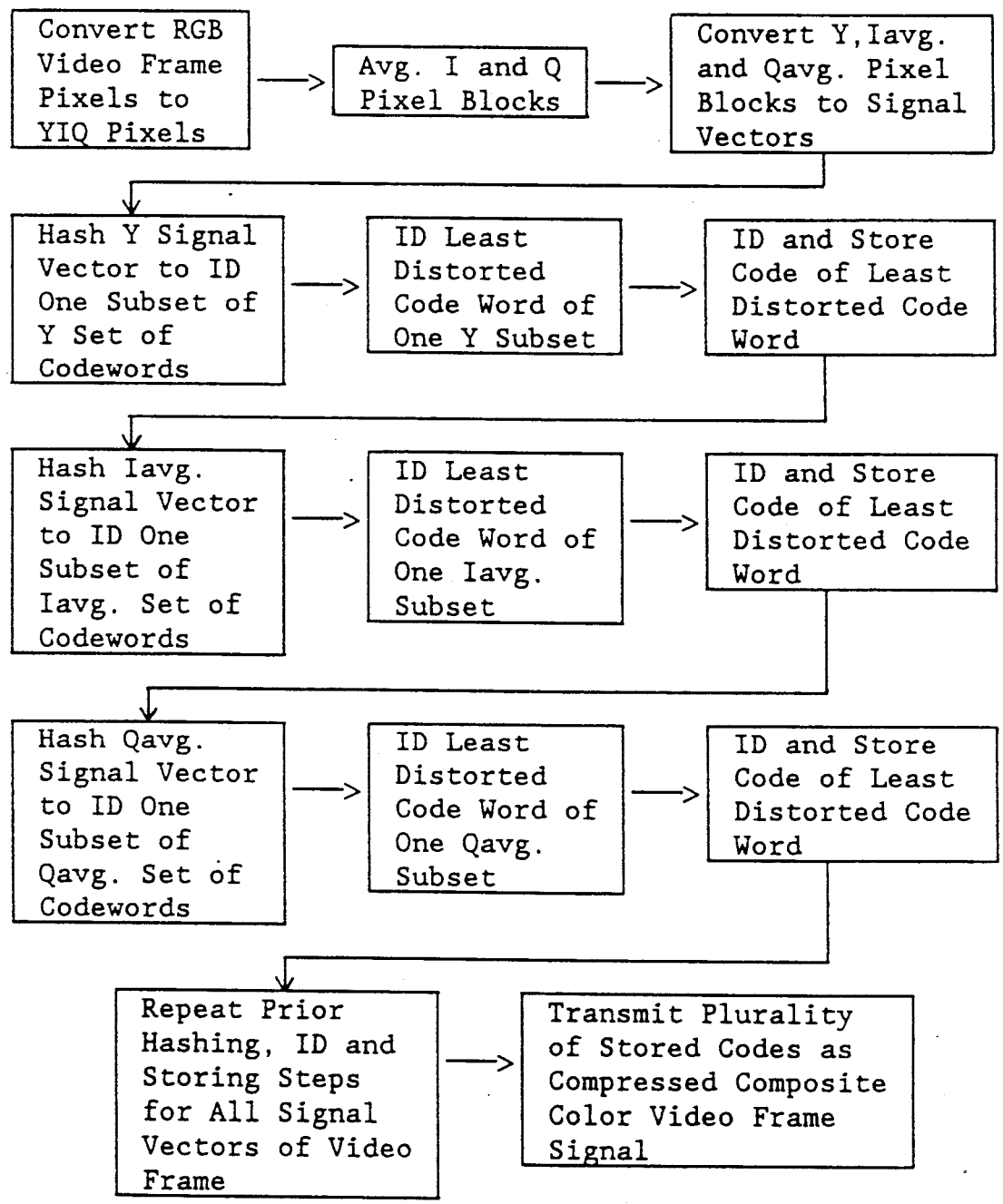
FIGS. 2a-2b depict diagrammatically by steps a method for capturing, compressing, transmitting in compressed form and decompressed form by individual frame an original composite color video signal.
Figure 2B:
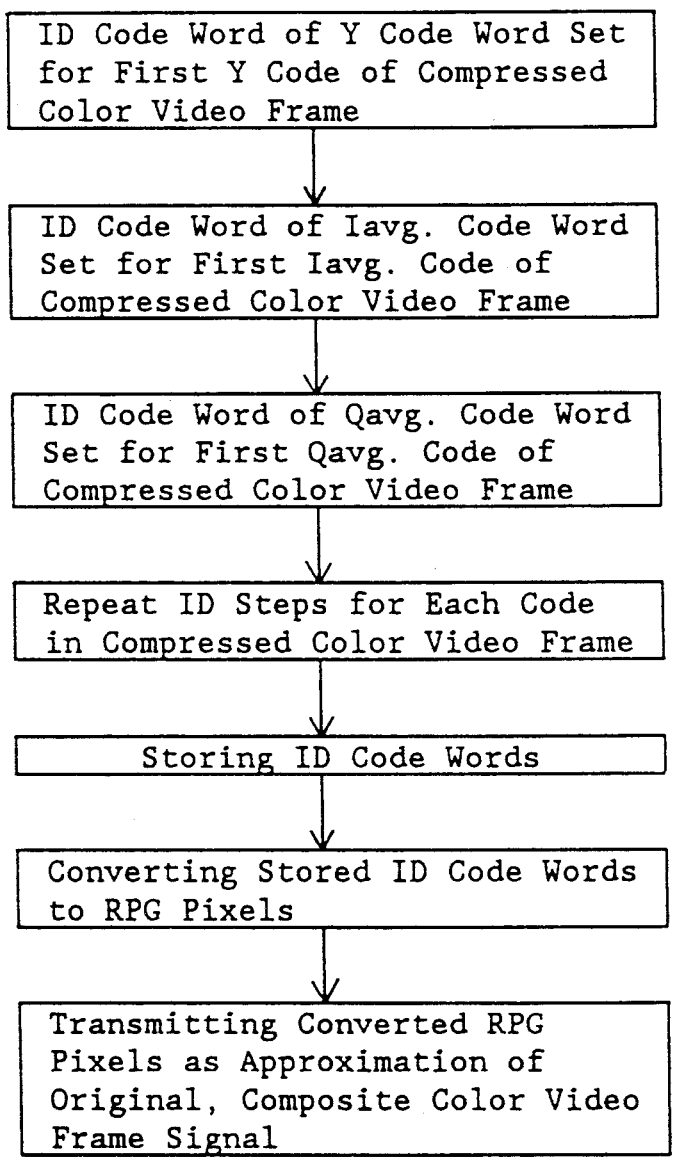

FIG. 1 depicts a preferred embodiment of the invention in the form of a vector quantizer for compressing and decompressing color video signals. The vector quantizer is indicated generally at 10 and is preferably an IBM ® PC-AT or comparable personal computer, which has been modified by the addition of a video signal processing board 12 and application software to configure the device to perform the compression and decompression methods of the invention. For convenience, the vector quantizer 10 will be referred to simply as "computer 10".

The computer 10 includes, in addition to the board 12, a central processor unit (CPU) 14, a volatile or dynamic memory indicated generally at 16, a keyboard 18 coupled with the CPU 14, a video monitor 20 and at least one floppy magnetic disk drive 22 with disk 24 (in phantom). The system also preferably includes a binary data storage device 32 which preferably includes a single, removable, transportable, record storage element 34 (in phantom). The binary data storage device 32 may be any conventional device which has sufficient binary data storage capacity and is compatible for data transfer with the computer 10. These can include any of a variety of disk and magnetic tape drives, other computers, etc. Element 34 could be a floppy, hard or optical disk, magnetic tape, etc., or, even conceivably, removable integrated circuit memory chip(s) or board(s). In the computer 10, the video processing board 12, CPU 14, dynamic memory 16, video monitor 20 and floppy disk drive 22 are coupled together for two-way communication by a data bus indicated generally at 26. Keyboard 18 is directly coupled to the CPU 14 by channel 28. Data storage device 32 is coupled to the data bus 26 and the other components of the computer 10 through an I/O port 30 which is coupled to the data bus 26.

The video processing circuit board 12 is preferably a Targa 16 distributed by Truevision Inc. of Indianapolis, IN or comparable board such as an EV 680 distributed by Vision Technologies of Fremont, California. Either board is configured by means of a so-called "daughter board" to receive a standard analog NTSC format (ISO 170) composite color video signal or Red, Green, Blue ("R, G, B") color video component signals, identify one video frame of the signal(s), digitize the data of the signal(s) for the frame into five-bit, R, G, B pixels and temporarily store the R, G, B pixels in three, two-dimensional arrays in an image storage circuit provided on the card 12 and indicated diagrammatically at 13b in FIG. 1. The card 12 is further configured to take R, G and B five-bit pixels from the three pixel planes, combine them with other signals and data in a known, conventional manner to generate R, G and B analog signals or a composite, NTSC format (ISO 170) color video signal and to transmit the signal(s) for recording or display. The card 12 is designed to be received in one of the available card locations of the computer 10 and is coupled automatically with the internal data bus 20 upon installation. The video processing boards 12 which have been identified further include connector pins which are positioned on the board to extend through the back of the cabinet (not depicted) of the computer 10 for coupling with input and/or output line(s) indicated diagrammatically at 36 and 38, respectively, carrying video signals to and from the card 12. The card 12 is configured for operator control through the computer 10 and its keyboard 18. The operator can select through the keyboard 18 a single video frame for digitization and storage on the card 12. The operator can further control the generation of a video signal from data stored in the image storage circuit portion 13b of the card 12 for outputting the color video signal(s) 38 from the card 12. The identified cards further include the capability of passing inputted video signal(s) 36 through the card 12 and outputting the signal(s) 38 for display on a conventional color television or color monitor 40, if such a monitor is provided. The image storage circuit portion 13b of the identified cards 12 have about one-half megabyte of storage capacity and dual ports.

Preferably, the application software, including first, second and third sets of code words used by the software, are provided on a floppy disk 24 which can be received in the floppy disk drive 22 provided with the computer 10. The application software on the floppy disk 24 partitions the dynamic memory 16 into first, second and third areas 42, 44 and 46. Each area 42, 44, 46 stores a different set of the binary code words which are included with the application software. The application software further partitions the dynamic working memory 16 into a compressed video image storage area 48 and other temporary work areas (not specifically indicated). Area 48 is used to store a compressed binary representation of the data from one video frame from an original color video signal captured by the board 12 for compression by the computer 10, or a binary representation of the data compressed from one image frame of an original color video signal to be decompressed. When programmed, portions 42, 44 and 46 of memory 16 individually constitute first, second and third code books containing different sets of code words and collectively constitute a first data storage means for storing plural different sets of binary code words, namely the first, second and third different sets of binary code words. Portion 48 functions as a second data storage means for inal video signal in the form of a plurality of binary codes. Of course, separate data storage devices and/or different data storage devices could be used.

Operation of the computer 10 in signal compression is straightforward and is explained first. The application software, including the first, second and third sets of code words, are entered into the computer 10 via disk 24 and device 22. Preferably, the sets include 8192, 1024 and 1024 code words, respectively, organized into 128 subsets in each set by the applicaorga tion software. A suitable source (not depicted) such as a video camera, video recorder, video cassette recorder, etc., supplies a conventional, NTSC format (ISO 170) original color video signal on line 36 to the imaging card 12. In response to a command through the keyboard 18, the CPU 14 causes the identified image card 12 to capture and digitize the color video signal on line 36 for a single image frame as sets of R, G and B pixels of five binary bits each. The R, G, B pixels represent only one of several possible collections of data element components into which the data of the composite color video signal can be converted. Preferably, each set of the R, G and B pixels is stored in the image storage circuit 13b as a separate two-dimensional 512×480 array, the locations of the pixels in each array corresponding to their physical location in the original image frame. Thereafter, the CPU 14 compresses the original signal data, represented by component data elements (R, G, B pixels) stored in the three arrays, through the following sequence of steps.

R, G and B pixels are read from each of the two-dimensional arrays in the image storage circuit 13b by the CPU 14 in 12×12 blocks and temporarily stored as separate 12×12 blocks in working portions of the dynamic memory 16. Because the 512×480 arrays will not divide evenly into 12×12 blocks, the CPU 14 is programmed to ignore the first four and last four columns of pixels in each array in the storage circuit portion 13b of the card 12. As these pixels are located along the side edges of the video image frame, they seldom contain significant data and their loss is really not noticeable. Of course, one of ordinary skill will appreciate that the computer could be programmed to use all 512×480 pixels by generating four columns of imaginary pixels along one of the two vertical sides to create a number of columns evenly divisible by twelve.

Preferably, each of the R, G, B pixels is stored in dynamic memory 16 as an eight-bit byte. The 12×12 R, G, B pixel blocks in memory 16 are converted by the CPU 14 into 12×12 of luminance (Y) and chrominance color difference component pixel blocks (I and Q) using known matrix conversion relations disclosed in our earlier related U.S. Pat. application Ser. No. 4,979,039, filed Jan. 30, 1989, which is hereby incorporated in its entirety with U.S Pat. No. 4,558,350 by herein. The R, G, B pixels are converted to Y, I and Q pixels with eight-bit accuracy and all eight bits of each Y, I, Q pixel are stored and used in subsequent steps to be described in the conversion of the pixels to signal vectors, which are compressed, as will now be described.

The CPU 14 converts the 12×12 Y pixel block into four, 6×6 Y signal vectors, by selecting the Y pixels in 6×6 quarter blocks for the 12×12 Y pixel block. The pixels of each quarter block constitute the elements of 6×6 signal vectors. Preferably, the CPU 14 selects a first quarter block of pixels, orders it into a first (Y) signal vector and compresses the first signal vector into a first, thirteen-bit binary code, which is temporarily stored in memory 16. The conversion, compression and temporary storage steps are repeated for each 6×6 quarter block of the 12×12 Y pixel block until the entire 12×12 Y pixel block, originally represented by 1152 binary bits in memory 16, is compressed to four, thirteen-bit binary codes.

The CPU 14 next converts the 12×12 I pixel block into a 6×6 averaged I signal vector by averaging each 2×2 block of I pixels in the original 12×12 block into a single averaged I pixel and ordering the resulting thirty-six averaged pixels into the 6×6 averaged I signal vector. The CPU 14 thereafter compresses the 6×6 averaged I signal vector to a ten-bit code which is also temporarily stored. The 12×12 Q pixel block is compressed in the same manner as the I block by converting the Q pixel block into a 6×6 averaged Q signal vector and compressing that resulting signal vector into a ten-bit code, also temporarily stored. Each ten-bit code replaces 1152 binary bits in the original 12×12 I and Q arrays. The seventy-two bits (four, thirteen-bit codes and two, ten-bit codes) are organized into nine, eight-bit byte blocks and transferred to the compressed signal storage area 48.

The steps are thereafter repeated for each successive 12×12 block of R, G and B pixels stored in the temporary memory portion 13b of the processing card 12 until all pixels of the image frame of the original video signal to be read are read from the card 12 and reduced to a plurality of ten-bit and thirteen-bit codes stored in the compressed image storage area 48 of the memory 16. These steps result in the compression of the 504×480 central portions of the three, original 512×480 R, G, B pixel arrays in storage circuit 13b. The remaining bits in circuit 13b are ignored.

After the entire frame of the original color video signal has been compressed in this manner, the resulting collection of ten-bit and thirteen-bit codes stored in portion 48 of memory 16, which represents the compressed data of the original signal, can then be transmitted by the computer 10 as ordinary data over the bus 26 and/or through an input/output port of the computer, like port 30, to binary data storage device 32 or to any other nearby compatible, permanent or temporary data storage device, and/or using conventional long distance transmission techniques with modems to individual or networked remotely located data processing and/or storage devices (none depicted). If the device 32 includes a removable, single, record storage element 34, the compressed video signal, or more specifically its data, can be stored, removed and physically transported from location to location.

Compression is again accomplished as it was done in the related U.S. Pat. No. 4,979,039, by hashing. Specifically, each of the plurality of Y and averaged I and Q signal vectors, representing component data of the original video signal, is hashed individually in turn to yield a value or index identifying one of at least three different subsets (preferably one of 128 different subsets) of code words in one of the first, second and third sets of code words stored in 42, 44 and 46. The code words of each set are used to represent the corresponding I, averaged Y and Q signal vectors when the compressed data of the original signal is decompressed. In the present embodiment, each code word is identical in length to each of the hashed signal vectors, namely 288 bits, so as to replace the signal vectors identically. In particular, the CPU first hashes the first Y signal vector converted from the original signal to identify uniquely one of the 128 subsets of the first set of code words 42. The CPU identifies one code word of the one selected subset having the least distortion with respect to the first signal vector and identifies the shorter, associated code of the one code word and temporarily stores the code as a compressed representation of the vector. The CPU 14 hashes and compresses each of the three remaining Y vectors in the same way. Then the CPU 14 hashes the averaged I signal vector and identifies one of the 128 different subsets of the second set of code words 46, identifies the one code word of the one identified subset having the least distortion with respect to the averaged I signal vector, identifies and temporarily stores the shorter associated code of the one code word as a compressed representation of that signal vector. These steps are repeated for the averaged Q vector with the third set of code words 46.

An important aspect of the present invention is that different sets of code words, specifically three different sets are provided, one set each for Y, averaged I and averaged Q signal vectors, for compressing the original signal. Preferably, the Y set of code words contains 128 different subsets or code-groups of code words, with each subset preferably containing sixty-four different code words. Preferably, the averaged I and averaged Q code word sets each contain 128 different subsets or code-groups. However, each subset preferably contains only eight code words. As the Y code book contains 8,192 different code words, each code word can be represented by a unique, associated thirteen-bit binary code representing integers 0-191. The averaged I and averaged Q code books each contain 1,024 different code words. Each code word of these code books can be represented by a unique, associated ten-bit binary code representing integers 0-1023. Thus, the length of the codes which are needed to identify their associated code words are less than the length of the code words themselves (288 bits). Moreover, the lengths of the averaged I and Q code word codes are different from and, specifically, are less than the length of the Y code word codes. Preferably, these codes are used to uniquely identify associated individual, code words in each area 42, 44 and 46, storing the individual code words, by an indirect pointer method. A sequence of codes from zero to the total number of code words in the set is allotted and the code words are stored sequentially according to their associated codes. Each code word is then addressed by adding to an absolute address identifying the memory location of the first code word (having a zero code) of the set, the associated code of the selected code word or a number generated from that associate code being combined with the absolute address so that the resulting number corresponds to the memory address of the associated code word.

As was indicated above, after hashing each signal vector to identify one of the 128 different subsets of the appropriate first, second or third sets of code words 42, 44 or 46, the code word of the one identified subset having the least distortion with respect to the hashed signal vector is determined and the code of that one code word of the identified subset having the least distortion with respect to the hashed code word is identified and stored.

Again, distortion is preferably determined by differencing each of the thirty-six data elements (pixels or averaged pixels) of each signal vector and corresponding elements of each code word, squaring the differences and summing the squares. The lowest sum represents the least distortion. The ten- or thirteen-bit code associated with the one code word of the identified subset found to have the least distortion with respect to the hashed signal vector is identified and that code is temporarily stored until it is grouped with other codes and transferred to the compressed video image storage area 48 of the dynamic memory 16 as a nine-byte block. The process is repeated and continued for each 12×12 R, G and B pixel blocks from the memory processing card 12 until the 504×480 control portions of the three original R, G, B pixel planes in the board 12 are compressed.

Each of the Y, averaged I and averaged Q signal vectors is hashed in the following manner to identify one of the 128 subsets of code words of the appropriate set. The five most significant bits of each of the thirty-six I pixels, which bits represents a numerical value between zero and thirty-one, are summed to yield a number between zero and 1116. This and all of the following numbers are integers. If the sum is below or equal to 928, it is divided by four to yield a number between zero and 232. If the sum is above 928, 928 is subtracted from the sum and the result divided by eight to yield a number between zero and twenty-three. This number is then added to 232 yielding a number between 232 and 255. The resulting number between zero and 255 is divided by two to yield an integer value or index between zero and 127, each value corresponding to one of the 128 different subsets of the first, Y set of code words 42.

A study of histographic plots of sample images from conventional entertainment video sources (VCR tapes, television, optical video disks) indicated that less than one percent of the Y signal vectors converted from such sources generate a value above 116 when hashed this way. Thus, it is believed there is little significant distortion introduced by treating the sums above 928 in this different manner.

Each averaged I and averaged Q signal vectors is hashed by summing the numerical value of each of the thirty-six averaged pixels contained in each vector. Since the numerical values of these pixels can be negative and are fractional, this yields a sum between the integer values of $-557$ to $+558$. An analysis of histogram plots of the same sample color video images indicated little probability of significant data below about $-255$ or above $+256$ for these vectors. Any sum outside the values $-255$ and $+256$ is replaced by the closest one of those two values. The resulting number is added to 255 and the result divided by four yielding a value or index between zero and 127, identifying one of the 128 different subsets of code words of either the second (averaged I) or third (averaged Q) sets of code words, 44 or 46, respectively. Distortion is determined in the same manner as with the hashed Y signal vectors by differencing, squaring and summing. The ten-bit code associated with the one code word of the one selected subset having least distortion with respect to the hashed averaged I or hashed averaged Q signal vector is identified and eventually stored in the compressed video image portion 48 of the memory 16.

Each of the first, second and third sets of code words was created by analyzing a statistically significant number (for example, 200) of randomly selected, video image frames of the type of images desired to be compressed. The video image frames selected for generating the three sets of code words were random in that they were images selected from a multiplicity of different and unrelated entertainment video sources. However, preference was given to sample frames containing detailed images providing a wide range of pixel variations. Study of the histographic distribution of the sums for the pixel elements of the different signal vectors suggested the foregoing hashing functions. The individual code words of each subset were also statistically selected and were the sixty-four (Y) or the eight (averages I or Q) most frequently occurring signal vectors from the statistically significant set of images hashed located in the subset using these hashing functions.

Decompression is substantially the reverse of compression and utilizes the same apparatus. Compressed data from a single, color video signal image frame is read from a source such as the record storage element 34 of the binary data storage device 32 (or any other conventional source) and loaded into the portion 48 of the dynamic memory 16 reserved for storing the compressed data of a video signal image frame. The CPU 14 reads nine, eight-bit bytes from the stored, compressed signal in area 48 and blocks the bits into the original, four thirteen-bit codes and two ten-bit codes. The CPU identifies each thirteen-bit code and the Y code word associated uniquely with each thirteen-bit code, reads the associated code word from the first set of codes 42 in the dynamic memory 16, and converts the read code word into a $6 \times 6$, eight-bit pixel array in a work area of the dynamic memory 16. The CPU 14 then identifies the first, ten-bit code and the one code word in the second (averaged I) set of code words 44, which is uniquely associated with that ten-bit code. The CPU 14 orders the bits of the one identified code word into thirty-six, eight-bit bytes, each corresponding to an averaged I pixel, in a $6 \times 6$ array. Each eight-bit, averaged I pixel byte is duplicated in adjoining blocks of a $2 \times 2$ array to create a $12 \times 12$ block of averaged I pixels in the working area of dynamic memory 16. The CPU 14 repeats this process for the second, ten-bit code of the block and generates a $12 \times 12$ averaged Q pixel block in memory 16.

The CPU then converts the three, $12 \times 12$ Y, averaged I and Q pixel blocks into three $12 \times 12$ R, G, B pixel blocks and stores the blocks in the memory 16. The CPU 14 reads the five most significant bits of each pixel from each R, G, B block in memory 16 into the appropriate locations of the storage circuit 13b of the card 12. The process is repeated until all of the compressed, nine-byte code blocks are converted into $12 \times 12$ R, G, B pixel blocks and three, $504 \times 480$ R, G, B pixel arrays are loaded into the temporary storage circuit 13b portion of the image card 12. Circuitry in the image card 12 automatically converts the stored binary pixels in circuit 13b into a composite NTSC color video analog signal (or component, analog R, G, B signals) on command from the CPU 14 and outputs the analog signal(s) from the image card 12 on line 38 for display on a television set or video monitor 40 and/or for storage on any suitable storage device such as a videocassette recorder (not depicted).

It has been found that by providing separate different sets of code words for each component and a significantly larger set of code words for the luminance (Y) component than is provided for either of the chrominance (I and Q) components of the composite color signal and by tailoring each set of code words specifically to the video images which are likely to be encountered, that even greater compression with less distortion has been achieved in the present invention than was achieved in the original invention disclosed in the aforesaid U.S. application Ser. No. 303,795 which used a single set of predetermined code words for conversion of all of the components.

The present invention may be embodied in other specific forms without departing from the spirit or essential attributes thereof. As one can appreciate, by the addition of an appropriate imaging card and application software, including the necessary sets of code words, various commercially available personal computers can easily be converted into apparatus of the present invention for compressing and/or decompressing color video signals.

The specific sixteen-bit video image processing board identified for use with the preferred embodiment of this invention are only two of a variety of different commercially available boards. Moreover, some of the other boards now available permit or require different compression schemes. For example, it is now possible to obtain from the two previously indicated companies other video image processing boards which can work with or can convert conventional NTSC color video signals into U and V chrominance component pixels. In particular, Truevision offers the Targa 16 with a Y, U, V daughter board which converts conventional NTSC format (ISO 170) video signals into five-bit luminance (Y) and chrominance (U and V) component pixels. The organization of a vector quantizer around such a board would eliminate the step performed by the abovedescribed, presently preferred embodiment of the invention of converting the R, G, B pixels from the board 12 to luminance and I, Q chrominance component pixels. Both Trivision and Viscon Technologies also offer thirty-two bit boards which can be used to convert the original signals into ten binary bit R, G, B pixels. Other sources offer other boards. For example, Highres Technologies of Lewiston, NY offers a HRT512-24 board digitizing analog video signals into eight-binary bit R, G and B pixels. The additional R, G, B pixel bits offer higher color resolution. However, the five-bit R, G, B resolution provided by the board 12 used in the presently preferred embodiment of the invention provides good color resolution with existing, conventional NTSC ISO 170 format video monitors and television sets with which the invention is most likely to be used.

While the preferred use of the invention is the compression and/or decompression of color video signals, the method is broadly applicable to the compression and decompression of any signal carrying video or audio data intended for viewing or hearing by human beings. Thus, it is envisioned that the present invention can be used to compress audio signals as well as component video signals such as merely luminescence signals. Moreover, the compression and decompression methods are further suitable for implementation by parallel processing which conceivably could permit the real-time or near real-time conversion, transmission and deconversion of continuous color video signal frames.

One of ordinary skill will appreciate that the compressed signal (i.e. the collection of selected binary codes) generated by the compression apparatus and method of the invention is unique, as is the decompressed signal (binary R, G, B arrays) generated from the compressed signal data. Accordingly, the invention includes the compressed representation (data) of the signal generated by the disclosed method and any record storage medium storing either the compressed signal representation (data) generated by the compression method of the present invention or the decompressed signal representation (data) generated from the compressed data of the signal by the disclosed method and apparatus. Accordingly, reference should be made to the appended claims, rather than to the foregoing specification, as indicating the scope of the invention.

We claim:

1. A method of compressing an original signal convertible into a plurality of binary signal vectors, each signal vector containing a plurality of data elements of the original signal to be compressed, the method comprising the steps of:
    hashing a first signal vector converted from the original signal to identify one of at least three different subsets of a first set of code words, each code word of the first set having a unique, associated binary code, each code associated with the first set of code words having a first predetermined length less than the length of the first signal vector;
    storing a first code associated with one of the code words from the one identified subset of the first set as a compressed representation of the first signal vector;
    hashing a second signal vector converted from the original signal to identify one of at least three different subsets of a second set of code words, each code word of the second set having a unique, associated binary code, each code associated with the second set of code words having a second predetermined length less than the length of the second signal vector and the second set of code words differing from the first set of code words; and
    storing a second code associated with one of the code words from the one selected subset of the second set as a compressed representation of the second signal vector.

2. The method of claim 1 further comprising converting the original signal to be compressed into the plurality of signal vectors including the first signal vector and the second signal vector.

3. The method of claim 2 wherein the original signal to be compressed is a composite signal and wherein each data element of the composite signal is a composite of plural component data elements wherein the converting step comprises the steps of:
    converting composite data elements from a portion of the composite signal into the first signal vector; and
    converting at least some of the same composite data elements from the portion of the composite signal into the second signal vector.

4. The method of claim 1 wherein the original signal to be compressed comprises a video signal and wherein one of the first and second signal vectors contains luminance data from the video signal.

5. The method of claim 4 wherein the video signal is a color video signal and wherein the remaining one of the first and second signal vectors contains chrominance data from the color video signal.

6. The method of claim 5 wherein the remaining one of the first and second signal vectors contains hue data from the color video signal and further comprising the steps of:
    hashing a third signal vector converted from the original signal to identify one subset of a third set of code words, the third signal vector containing saturation data from the color video signal, the third set of code words differing from each of the first and second sets of code words, each code word of the third set having a unique, associated binary code, each code associated with the third set being less than the length of the third signal vector; and
    storing a code associated with a code word of the one identified subset of the third set of code words as a compressed representation of the third signal vector.

7. The method of claim 1 further comprising the collective steps of hashing each of a remaining plurality of signal vectors converted from the signal, identifying a code associated with a code word of one of a plurality of different sets of code words, including the first and second sets, for each of the hashed signal vectors, and storing the plurality of identified codes, including the first and second codes, on a record storage element as a compressed representation of the original signal.

8. A record storage medium storing the plurality of codes generated in accordance with the steps of method claim 7 as a compressed representation of the original signal.

9. The method of claim 1 further comprising the collective steps of having each of a remaining plurality of signal vectors converted from the original signal, identifying a code associated with a code word of one of a plurality of different sets of code words, including the first and second sets, for each of the hashed signal vectors, and transmitting the plurality of identified codes, including the first and second codes, as a compressed binary signal representation of the data elements of the original signal.

10. The binary signal generated in accordance with the steps of the method of claim 9.

11. An apparatus for compressing an original signal convertible into a plurality of binary signal vectors, each signal vector comprising a plurality of data elements of the original signal to be compressed, the apparatus comprising:

first data storage means for storing sets of binary code words;

first and second different sets of binary code words stored in the first data storage means;

means for hashing signal vectors of the plurality to identify uniquely for each hashed signal vector one subset of code words from one of the different sets of code words stored in the first storage means; and second data storing means for storing as a compressed representation of the data of the original signal, a plurality of binary codes, each stored code being associated with one code word from the one subset of code words identified by the hashing means uniquely for each hashed signal vector.

12. The apparatus of claim 11 further comprising means for converting the original signal into the plurality of signal vectors.

13. A method of decompressing data compressed from an original signal and represented by a plurality of binary codes comprising the steps of:

identifying a first binary code word uniquely associated with a first code of the plurality, the first code word being longer than the first code;

identifying a second binary code word uniquely associated with a second code of the plurality, the second code word being longer than the second code and the second code being different in length from the first code; and storing in a data storage device, a decompressed binary approximation of the data of the original signal using a combination of the first and second binary code words.

14. The method of claim 13 wherein the device includes a single, record storage element and the storing step further comprises storing on the single, record storage element the decompressed binary approximation of the data of the original signal.

15. A single record storage medium containing the decompressed binary approximation of the data of an original signal generated in accordance with the steps of the method of claim 14.

16. An apparatus for decompressing data compressed from an original signal represented by a plurality of binary codes of at least two different lengths comprising:

first data storage means for storing sets of binary code words;

at least first and second different sets of binary code words stored in the first data storage means, the first set having a first number of code words and the second set having a second number of code words different from the first, each stored code word having a length longer than an associated binary code; and means for identifying for each code one of the different sets of code words from the first data storage means containing the one code word associated with the code and identifying the one code word of the one identified set associated with the code and for converting the identified code words into decompressed data elements approximating data of the original signal.

* * * * *